(12) United States Patent
Sung et al.

(10) Patent No.: US 9,818,836 B1
(45) Date of Patent: Nov. 14, 2017

(54) GATE CUT METHOD FOR REPLACEMENT METAL GATE INTEGRATION

(71) Applicant: GLOBALFOUNDRIES INC., Grand Cayman (KY)

(72) Inventors: Min Gyu Sung, Latham, NY (US); Ruilong Xie, Schenectady, NY (US); Chanro Park, Clifton Park, NY (US); Dong-Ick Lee, Loudonville, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/486,387

(22) Filed: Apr. 13, 2017

(51) Int. Cl.
*H01L 29/51* (2006.01)
*H01L 29/66* (2006.01)

(52) U.S. Cl.
CPC ...... *H01L 29/513* (2013.01); *H01L 29/66545* (2013.01)

(58) Field of Classification Search
CPC .................. H01L 29/513; H01L 20/66545
See application file for complete search history.

(56) References Cited

U.S. PATENT DOCUMENTS

| 9,490,217 | B1* | 11/2016 | Lin ..................... H01L 29/785 |
| 9,558,950 | B1* | 1/2017 | Cheng .............. H01L 29/66545 |
| 9,721,848 | B1* | 8/2017 | Bu .................. H01L 21/823878 |
| 2013/0020707 | A1 | 1/2013 | Or-Bach et al. |
| 2013/0095580 | A1 | 4/2013 | Or-Bach et al. |
| 2013/0122672 | A1 | 5/2013 | Or-Bach et al. |
| 2015/0115267 | A1* | 4/2015 | Gu ..................... G01R 31/2621 257/48 |
| 2016/0056181 | A1* | 2/2016 | Anderson .......... H01L 27/1211 257/347 |
| 2016/0163810 | A1* | 6/2016 | Huang ............. H01L 29/42392 257/329 |
| 2016/0233337 | A1* | 8/2016 | Basker ................ H01L 29/6681 |
| 2016/0247728 | A1* | 8/2016 | You ................ H01L 21/823821 |

* cited by examiner

*Primary Examiner* — William Coleman
(74) *Attorney, Agent, or Firm* — Scully Scott Murphy and Presser; Frank Digiglio

(57) ABSTRACT

A method of manufacturing a FinFET structure involves forming a gate cut within a sacrificial gate layer and backfilling the gate cut opening with etch selective dielectric materials. Partial etching of one of the dielectric materials can be used to increase the distance between the gate cut (isolation) structure and an adjacent fin relative to methods that do not perform a backfilling step using etch selective materials.

15 Claims, 6 Drawing Sheets

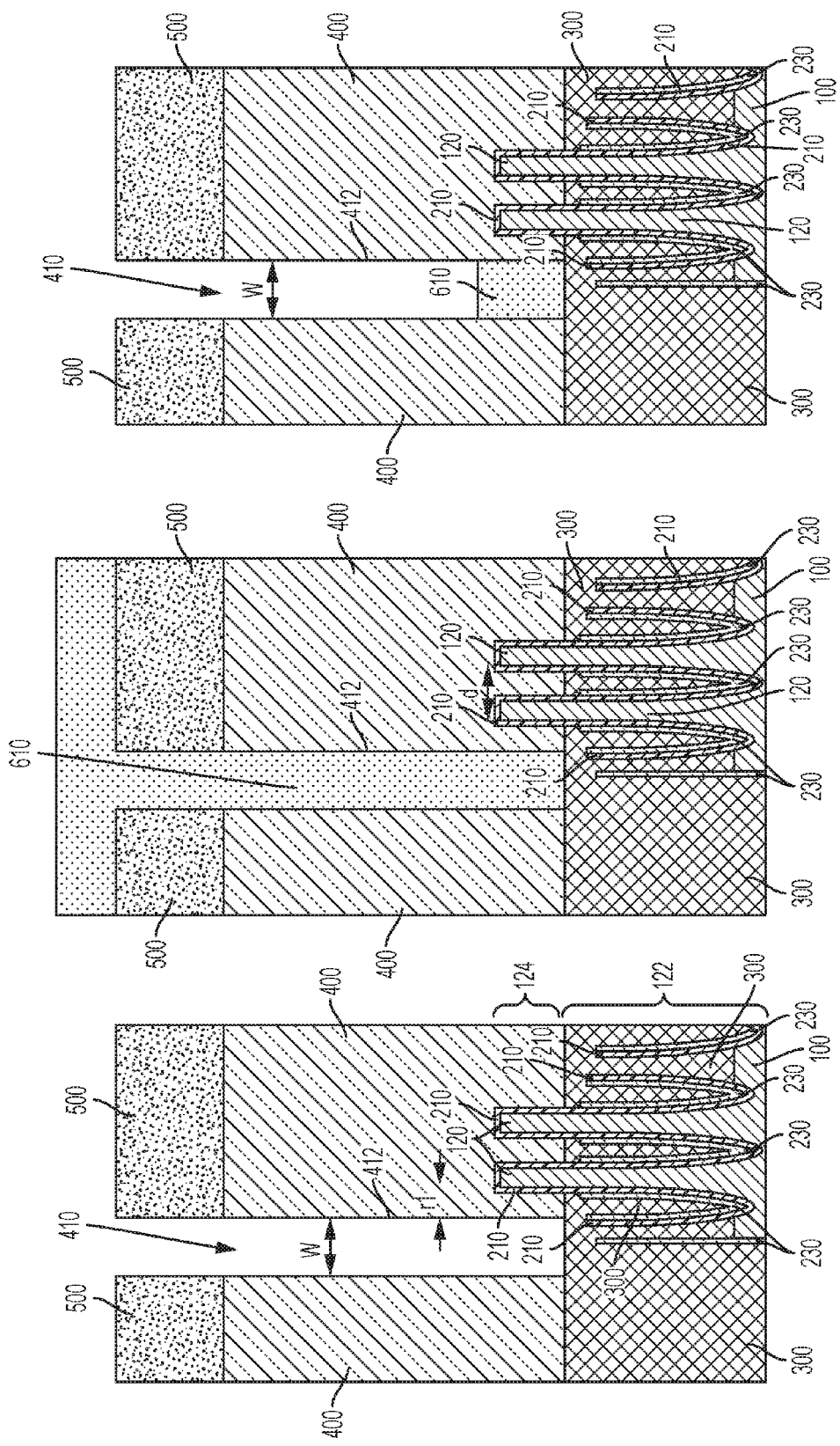

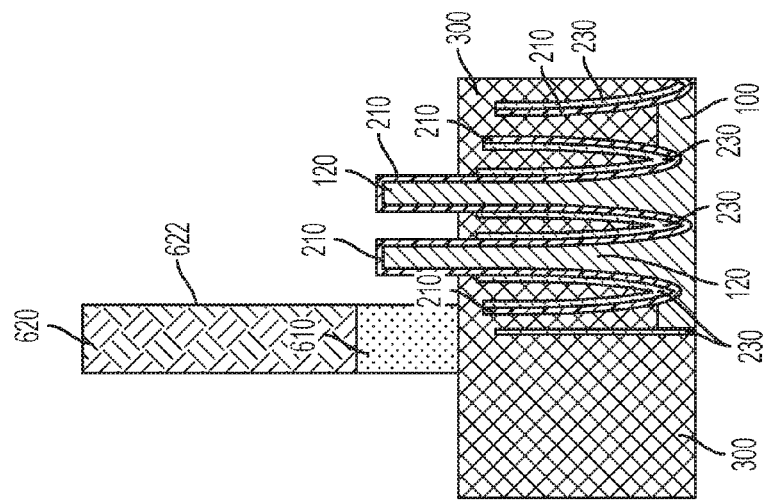
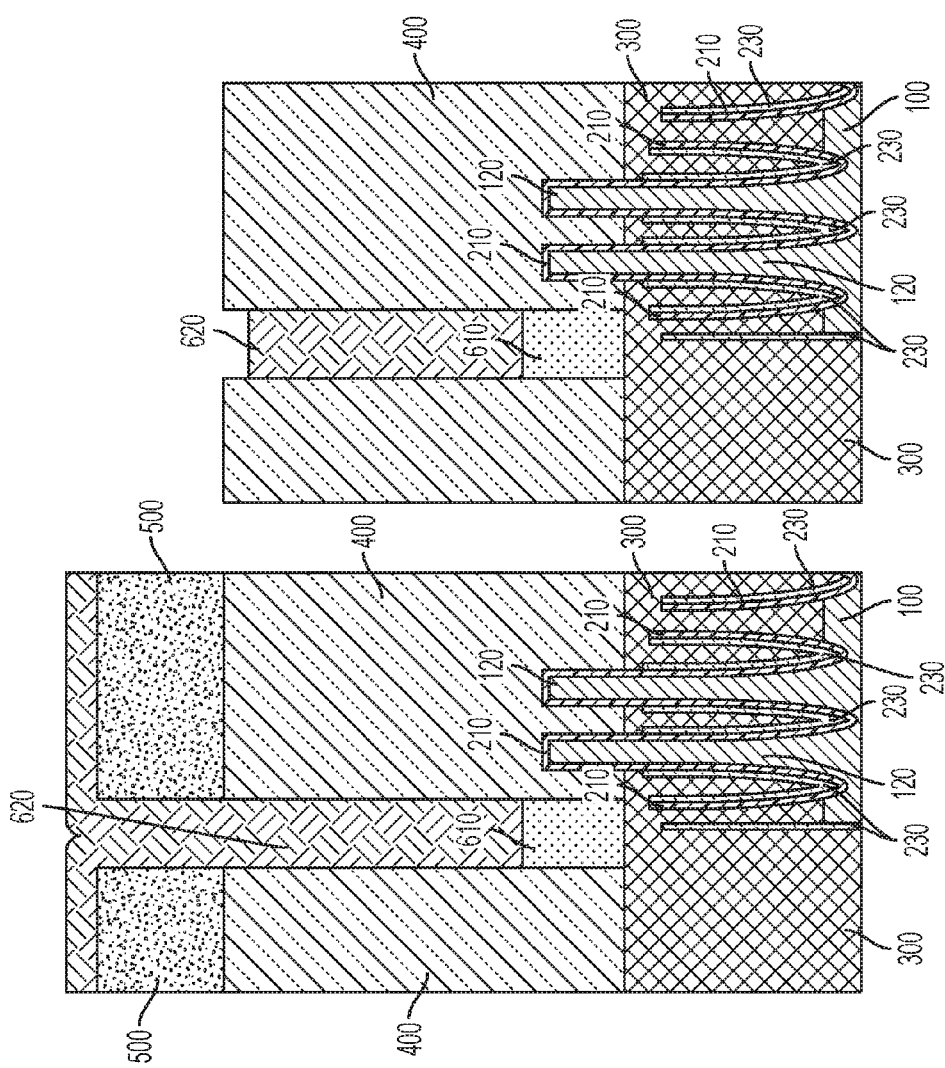

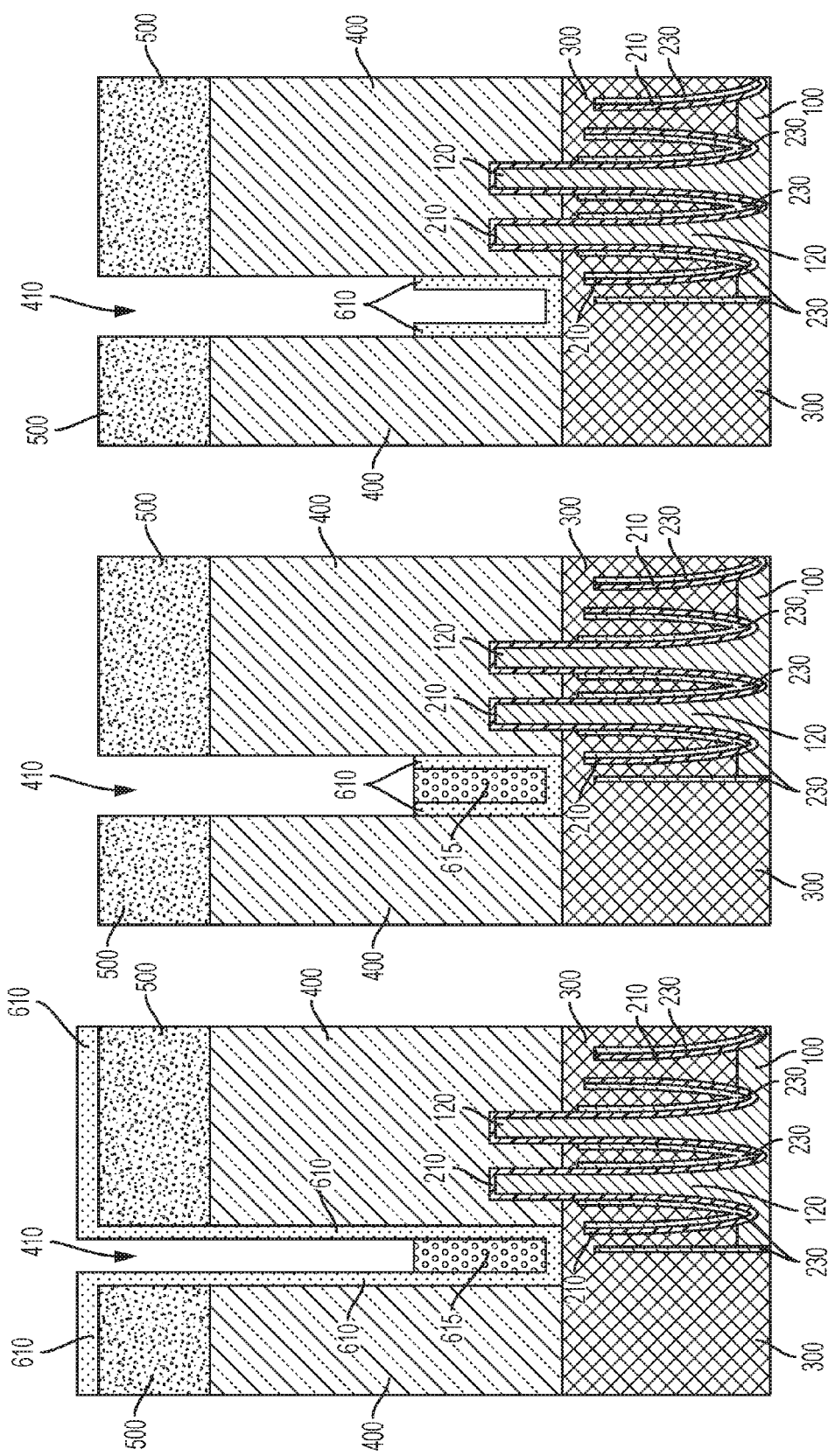

GATE CUT METHOD FOR REPLACEMENT METAL GATE INTEGRATION

BACKGROUND

The present application relates generally to semiconductor devices, and more specifically to methods for manufacturing fin field effect transistors.

Fully-depleted devices such as fin field effect transistors (FinFETs) are candidates to enable scaling of next generation gate lengths to 14 nm and below. Fin field effect transistors (FinFETs) present a three-dimensional architecture where the transistor channel is raised above the surface of a semiconductor substrate, rather than locating the channel at or just below the surface. With a raised channel, the gate can be wrapped around the sides of the channel, which provides improved electrostatic control of the device.

The manufacture of FinFETs typically leverages a self-aligned process to produce extremely thin fins, e.g., 20 nm wide or less, on the surface of a substrate using selective-etching techniques. A gate structure is then deposited to contact multiple surfaces of each fin to form a multi-gate architecture.

The gate structure may be formed using a gate-first or a gate-last fabrication process. A gate-last process, such as a replacement metal gate (RMG) process, utilizes a sacrificial or dummy gate, which is typically replaced by a functional gate after device activation, i.e., after dopant implantation into source/drain regions of the fins and an associated drive-in anneal, in order to avoid exposing the functional gate materials to the thermal budget associated with activation.

Prior to removing the sacrificial gate and forming a functional gate structure, a gate cut module may be used to sever the sacrificial gate layer and form an opening within select regions of the device architecture in order to isolate adjacent devices. In association with such a process, the sacrificial gate layer material removed from the openings is replaced with another dielectric material. However, in advanced nodes, the proximity of the backfilled layer to an adjacent fin may result in insufficient space for deposition of a complete functional gate structure (e.g., gate dielectric and gate conductor layers).

SUMMARY

Accordingly, it would be beneficial to provide a method for defining a sacrificial gate structure at critical dimensions with a high degree of accuracy and precision, especially a gate structure that enables formation of a functional replacement metal gate at advanced nodes without altering design rules or otherwise compromising real estate.

Disclosed is a gate cut scheme that may be used in conjunction with a replacement metal gate (RMG) process flow for manufacturing fin field effect transistors (FinFETs) where the gate cut and the associated backfill include the deposition of mutually etch-selective dielectric layers within the gate cut opening. Partial removal of one of the dielectric layers produces an undercut region that defines a wider gap between the remaining gate cut dielectric layer(s) and an adjacent fin.

In accordance with embodiments of the present application, the method includes forming a sacrificial gate layer over a plurality of semiconductor fins, and forming a gate cut opening that extends through the sacrificial gate layer, wherein the gate cut opening is laterally spaced away from a first one of the fins by a first distance. A first dielectric layer is deposited into the gate cut opening such that a height of the first dielectric layer is greater than a height of the first one of the fins. A second dielectric layer is then deposited into the gate cut opening and over the first dielectric layer. Then, sacrificial gate layer is removed and an etching step laterally etches the first dielectric layer to form a gap adjacent to the first one of the fins, wherein a width of the gap is greater than the first distance.

According to further embodiments, a semiconductor structure includes a fin disposed over a semiconductor substrate and a gate stack disposed over the fin, wherein the gate stack comprises a gate dielectric formed over the fin and a gate conductor formed over the gate dielectric. A gate cut dielectric layer is laterally spaced from the fin and contacts the gate stack. The gate cut dielectric comprises a first dielectric layer laterally spaced from the fin by a first distance and a second dielectric layer disposed over the first dielectric layer and laterally spaced from the fin by a second distance less than the first distance.

BRIEF DESCRIPTION OF SEVERAL VIEWS OF THE DRAWINGS

The following detailed description of specific embodiments of the present application can be best understood when read in conjunction with the following drawings, where like structure is indicated with like reference numerals and in which:

FIG. 1 is a simplified perspective diagram of a FinFET device at an intermediate stage of fabrication showing a sacrificial gate layer and a lithography stack disposed over semiconductor fins following a gate cut module;

FIG. 2 shows the deposition of a first dielectric layer into the gate cut opening formed during the gate cut module according to one embodiment;

FIG. 3 shows the structure of FIG. 2 following a recess etch of the first dielectric layer;

FIG. 4 illustrates the deposition of a second dielectric layer into the gate cut opening and over the first dielectric layer;

FIG. 5 shows removal of the lithography stack and excess second dielectric layer from over the sacrificial gate layer;

FIG. 6 illustrates selective removal of the sacrificial gate layer;

FIG. 10 shows a recess etch of the organic planarization layer within the gate cut opening to a height above the height of the fins;

FIG. 11 shows the structure of FIG. 10 following a recess etch of the first dielectric layer within the gate cut opening;

FIG. 12 shows removal of remaining portions of the organic planarization layer;

DETAILED DESCRIPTION

Figure 9:
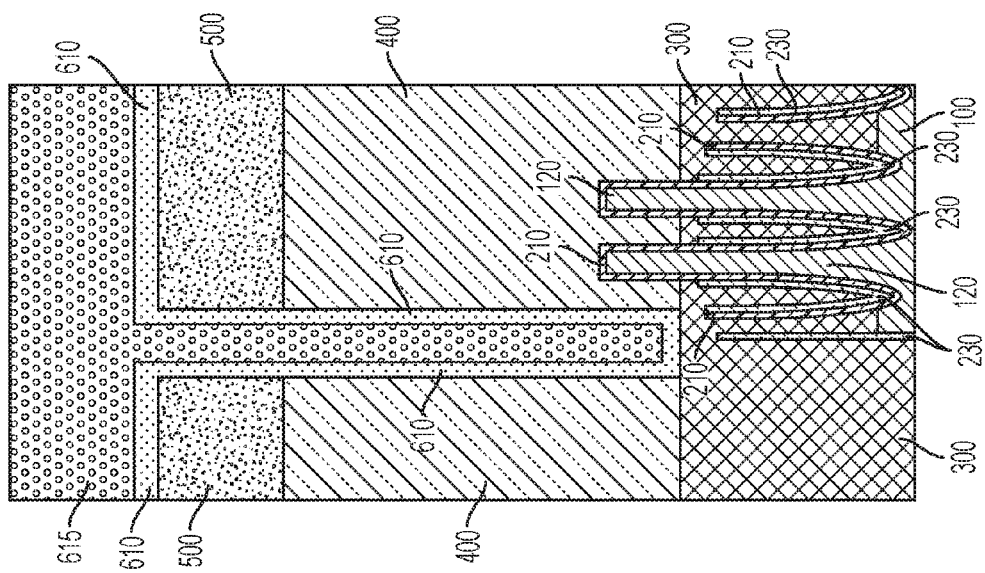
FIG. 9 illustrates deposition of an organic planarization layer within unfilled portions of the gate cut opening and over the conformal first dielectric layer.

Reference will now be made in greater detail to various embodiments of the subject matter of the present application, some embodiments of which are illustrated in the accompanying drawings. The same reference numerals will be used throughout the drawings to refer to the same or similar parts.

Disclosed are FinFET device structures and methods of manufacturing FinFET devices, and more particularly methods where segmentation of a sacrificial gate layer includes backfilling the associated gate cut opening partially with a first dielectric layer and then filling the remaining portion of the gate cut opening with a second dielectric layer. In various embodiments, the first dielectric layer can be etched selectively with respect to the second dielectric layer.

Segmentation includes providing a gate cut opening that extends through a sacrificial gate layer and parallel to a length direction of the fins. The first dielectric layer, which fills or partially fills a lower portion of the gate cut opening and is disposed proximate to an adjacent fin, may be at least partially removed during subsequent processing to form an opening into which a functional gate structure, including gate dielectric and gate conductor layers, can be deposited. The opening, which may be undercut with respect to the second dielectric layer, and the attendant increase in distance between the isolation dielectric filling the gate cut opening and an adjacent fin can be created without altering the design rules for the overall device. Various embodiments related to the formation of such FinFET structures are described herein with reference to FIGS. 1-17. A first embodiment is illustrated in FIGS. 1-7 and a second embodiment is illustrated in FIGS. 8-17.

A simplified cross-sectional view of a FinFET device at an intermediate stage of fabrication is shown in FIG. 1. The exemplary structure includes a semiconductor substrate 100 and a plurality of semiconductor fins 120 arrayed over the substrate 100. The semiconductor fins 120 are arranged in parallel and are laterally isolated from each other within sub-fin region 122 by a shallow trench isolation layer 300. The fins 120 extend above shallow trench isolation layer (STI) 300 and form an active device region 124.

Substrate 100 may include a semiconductor material such as silicon, e.g., single crystal Si or polycrystalline Si, or a silicon-containing material. Silicon-containing materials include, but are not limited to, single crystal silicon germanium (SiGe), polycrystalline silicon germanium, silicon doped with carbon (Si:C), amorphous Si, as well as combinations and multi-layers thereof. As used herein, the term "single crystal" denotes a crystalline solid, in which the crystal lattice of the entire solid is substantially continuous and substantially unbroken to the edges of the solid with substantially no grain boundaries.

The substrate 100 is not limited to silicon-containing materials, however, as the substrate 100 may comprise other semiconductor materials, including Ge and compound semiconductors, including III-V compound semiconductors such as GaAs, InAs, GaN, GaP, InSb, ZnSe, and ZnS, and II-VI compound semiconductors such as CdSe, CdS, CdTe, ZnSe, ZnS and ZnTe.

Substrate 100 may be a bulk substrate or a composite substrate such as a semiconductor-on-insulator (SOI) substrate that comprises, from bottom to top, a handle portion, an isolation layer (e.g., buried oxide layer), and a semiconductor material layer.

Substrate 100 may have dimensions as typically used in the art and may comprise, for example, a semiconductor wafer. Example wafer diameters include, but are not limited to, 50, 100, 150, 200, 300 and 450 mm. The total substrate thickness may range from 250 microns to 1500 microns, although in particular embodiments the substrate thickness is in the range of 725 to 775 microns, which corresponds to thickness dimensions commonly used in silicon CMOS processing. The semiconductor substrate 100 may comprise (100)-oriented silicon or (111)-oriented silicon, for example.

In various embodiments, fins 120 comprise a semiconductor material such as silicon, and may be formed by patterning and then etching the semiconductor substrate 100, e.g., a top portion of the semiconductor substrate. In several embodiments, the fins 120 are etched from, and therefore contiguous with the semiconductor substrate 100. For instance, fins 120 may be formed using a sidewall image transfer (SIT) process as known to those skilled in the art.

In embodiments, the fins 120 can have a width of 5 nm to 20 nm, a height of 40 nm to 150 nm, and a pitch of 20 nm to 100 nm, although other dimensions are also contemplated. Fins 120 may be arrayed on the substrate at a regular intrafin spacing or pitch. As used herein, the term "pitch" refers to the sum of the fin width and the spacing between neighboring fins. In example embodiments, the fin pitch may be within a range of 20 to 100 nm, e.g., 20, 30, 40, 50, 60, 70, 80, 90 or 100 nm, including ranges between any of the foregoing values, although smaller and larger pitch values may be used.

As shown in the illustrated embodiment, portions of the fins 120 may be coated with a thin conformal oxide layer, which is referred to herein as an extended gate or EG oxide layer 210. The EG oxide layer 210 may comprise silicon dioxide, for example, and may be formed over the fins within the subfin region 122 and/or the active device region 124. The EG oxide layer 210 may have a thickness of 2 to 3 nm. During the course of manufacturing the FinFET device, the EG oxide 210 may be stripped from source and drain regions of the fins and/or channel regions of the fins.

An isolation layer 230 such as a silicon nitride layer may be formed over the oxide (e.g., $SiO_2$) layer 210 within the subfin region 122. Shallow trench isolation (STI) layer 300 may also be used to provide electrical isolation between the fins 120 and between adjacent devices as is needed for the circuit(s) being implemented. An STI process for FinFET devices involves creating isolation trenches in the semiconductor substrate 100 through an anisotropic etch process. The isolation trench between each adjacent fin may have a relatively high aspect ratio (e.g., ratio of the depth of the isolation trench to its width). A dielectric filler material, such as silicon dioxide, is deposited into the isolation trenches, for example, using an enhanced high aspect ratio process (eHARP) to fill the isolation trenches. The deposited dielectric material may then be polished by a chemical-mechanical polishing (CMP) process that removes the excess dielectric material and creates a planar STI structure. The planarized oxide is etched back to form a recessed, uniformly thick oxide isolation layer 300 between the fins 120, where upper sidewalls of the fins 120 can be exposed for further processing.

As used herein, the compounds silicon nitride and silicon dioxide have compositions that are nominally represented as $Si_3N_4$ and $SiO_2$, respectively. The terms silicon nitride and silicon dioxide, refer to not only these stoichiometric compositions, but also to nitride and oxide compositions that deviate from the stoichiometric compositions.

As will be appreciated, the cross-sectional view of FIG. 1 is taken through channel regions of the fins perpendicular to a length direction thereof. A sacrificial gate layer 400 is disposed over and straddles the fins 120. The sacrificial gate layer 400 is formed over the fins 120 and over the STI layer 300, i.e., over substrate 100. The sacrificial gate layer 400 may comprise a blanket layer of amorphous silicon (a-Si), for example. Amorphous elemental silicon can be deposited using chemical vapor deposition, such as low pressure chemical vapor deposition (LPCVD) at temperatures ranging from 450° C. to 700° C. Silane ($SiH_4$) can be used as the precursor for CVD silicon deposition. The sacrificial gate layer 400 may have a thickness sufficient to completely cover the fins. For instance, a thickness of sacrificial gate layer 400 may range from 50 to 200 nm, e.g., 50, 75, 100, 125, 150, 175 or 200 nm, including ranges between any of the foregoing values, although lesser and greater thicknesses may be used. A CMP process may be used to planarize a top surface of the sacrificial gate layer 400.

"Planarization" refers to a material removal process that employs at least mechanical forces, such as frictional media, to produce a substantially two-dimensional surface. A planarization process may include chemical mechanical polishing (CMP) or grinding. Chemical mechanical polishing (CMP) is a material removal process that uses both chemical reactions and mechanical forces to remove material and planarize a surface.

Optionally, a sacrificial oxide layer (not shown) may be deposited over the sacrificial gate layer 400 prior to a CMP step and then subsequently removed during the CMP step in order to enhance planarization. During the planarization step, the sacrificial gate layer 400 may serve as a CMP etch stop. In certain embodiments, a non-selective etch such as a reactive ion etch (REE) of the post-planarized sacrificial gate layer 400 may be used to define the thickness of the sacrificial gate layer 400.

As will be described in further detail below, sacrificial gate layer 400 is adapted to be patterned and provide a structure for a replacement metal gate (RMG) module used to define a three-dimensional gate architecture over the fins. Depending on the design requirements for the associated device, the number of fins underlying the sacrificial gate structures may independently vary from 2 to 100, although a greater number of fins may be used.

Thus, in the illustrated embodiment, the sacrificial gate layer 400 has been segmented, or cut, in order to define a gate cut opening 410. The gate cut opening 410 separates remaining portions of the sacrificial gate layer 400 into discrete device regions. According to various embodiments, the gate cut openings are backfilled with a dielectric material in order to isolate the various sacrificial gate structures and hence the later-formed functional gate associated with respective devices. Independent transistors may be connected by local interconnection methods and/or back end of the line metallization layers to form integrated circuits, such as SRAM devices.

Referring still to FIG. 1, gate cut opening 410 may be formed by directionally etching the sacrificial gate layer 400. As shown in the illustrated embodiment, the gate cut opening 410 extends through the sacrificial gate layer 400 and exposes STI region 300. A gate cut opening 410 is configured to expose a portion of the STI layer 300 between adjacent fins without exposing the fins themselves.

Gate cut opening 410 may be formed using patterning and etching processes known to those skilled in the art. The patterning process may comprise photolithography, for example, which includes forming a layer of photoresist material (not shown) atop one or more layers to be patterned. The photoresist material may include a positive-tone photoresist composition, a negative-tone photoresist composition, or a hybrid-tone photoresist composition. A layer of photoresist material may be formed by a deposition process such as, for example, spin-on coating.

The deposited photoresist is then subjected to a pattern of irradiation, and the exposed photoresist material is developed utilizing a conventional resist developer. The pattern provided by the patterned photoresist material is thereafter transferred into the sacrificial gate layer 400 utilizing at least one pattern transfer etching process.

The pattern transfer etching process is typically an anisotropic etch. In certain embodiments, a dry etching process such as, for example, reactive ion etching (RIE) can be used. In other embodiments, a wet chemical etchant can be used. In still further embodiments, a combination of dry etching and wet etching can be used.

Patterning and etching the sacrificial gate layer 400 to form gate cut openings 410 may include forming a lithography stack 500 over the sacrificial gate layer 400. A lithography stack 500 may include one or more of an optical planarization layer, an etch stop layer, an amorphous carbon layer, an adhesion layer, an oxide layer, and a nitride layer (not separately shown). Such layers may be configured as known to those skilled in the art to provide a suitable masking layer to pattern and etch the sacrificial gate layer 400.

A gate cut opening 410 may have areal dimensions (length and width) that independently range from 15 to 40 nm, although lesser and greater dimensions may be used. According to various embodiments, the areal dimensions of the as-formed gate cut openings 410 are within lithography process windows for forming such structures, and enable the gate cut openings 410 to be defined with substantially vertical sidewalls. As used herein, "substantially vertical" sidewalls deviate from a direction normal to a major surface of the substrate by less than 5°, e.g., 0, 1, 2, 3, 4, or 5°, including ranges between any of the foregoing values. In certain embodiments, the width (w) of the gate cut opening 410 is less than 20 nm, e.g., 5, 10 or 15 nm.

In various embodiments, a distance (r1) between the sidewall 412 of the gate cut opening 410 and an adjacent fin may be less than 20 nm, e.g., 12, 14, 16 or 18 nm, including ranges between any of the foregoing values. Decreasing the distance (r1) beneficially impacts the achievable density of devices. However, decreasing the distance between adjacent structures may introduce design and processing challenges. As will be appreciated, such challenges may include the deposition of a functional gate stack, including a gate dielectric layer, gate conductor layer and conductive fill material within the available geometry, e.g., the space between the sidewall of the gate cut and a neighboring fin. Using the presently-disclosed methods, a structure can be formed having an increased distance between the sidewall of a gate cut dielectric and an adjacent fin without altering the design rules for the structure.

Referring to FIG. 2, a first dielectric layer 610 is deposited to substantially fill the gate cut opening 410. The first dielectric layer 610 may be formed by atomic layer deposition (ALD) and may comprise a material such as silicon dioxide. Thereafter, referring to FIG. 3, an etching step is used to remove the first dielectric layer 610 from over the sacrificial gate layer 400, i.e., from over the lithography stack 500, and to recess the first dielectric layer 610 within the gate cut opening 410. The etching step can comprise, for example, a reactive ion etching (RIE) process. According to various embodiments, the height of the first dielectric layer 610 following the recess etch is greater than the height of the neighboring fins 120, and may exceed the fin height by 10 to 200%, e.g., 10, 20, 50, 100, 150 or 200%, including ranges between any of the foregoing values.

Referring to FIG. 4, a fill layer 620 comprising a second dielectric material different from the first dielectric material is then deposited within gate cut openings 410 and over the first dielectric layer 610. In various embodiments, the fill layer 620 completely fills the gate cut openings 410. For instance, the fill layer 620 may be formed by atomic layer deposition (ALD) and may comprise a second dielectric material such as silicon nitride. In an exemplary ALD process, a silicon-containing precursor and a nitrogen-containing precursor are deposited in succession and reacted to form the nitride fill layer. In various embodiments, the dielectric materials for the first dielectric layer 610 and the second dielectric layer 620 are chosen such that the first dielectric layer 610 can be etched selectively with respect to the second dielectric layer 620.

As shown in FIG. 5, a chemical mechanical polishing step may be used to selectively remove the overburden following deposition of the fill layer 620 and produce a planarized structure. The sacrificial gate layer 400 may serve as a CMP etch stop during removal of the excess fill layer material, such that the CMP step removes the lithography stack 500 as well.

Thereafter, referring to FIG. 6, a selective etching step is used to remove the sacrificial gate layer 400. In embodiments where the sacrificial gate layer 400 comprises amorphous silicon, the sacrificial gate layer 400 can be etched and removed selectively with respect to silicon dioxide and silicon nitride using a wet etch chemistry comprising, for example, phosphoric acid, hydrofluoric acid and nitric acid.

Following removal of the sacrificial gate layer 400, a selective oxide etch can be used to remove the EG oxide layer 210 from over the fins and laterally etch the first dielectric layer 610 proximate to the fins 120, resulting in a distance (r2) between the sidewall 612 of the first dielectric layer 610 and the adjacent fin 120, where r2>r1. This additional region of gate beyond the fin is referred to as the gate endcap.

In various embodiments, the EG oxide is removed and the first dielectric layer 610 is etched using a buffered oxide etch, which can include a wet etching process or a vapor etching process that uses a buffered hydrofluoric acid (BHF) solution. By way of example, the BHF solution may comprise hydrofluoric acid (HF), ammonium fluoride ($NH_4F$) and water ($H_2O$). In a particular embodiment, the BHF solution contains 0.5 to 10 vol. % hydrofluoric acid, 30 to 50 vol. % ammonium fluoride, and 40 to 60 vol. % water. The BHF solution selectively etches the oxide layers 210, 610 without etching the other layers of the structure.

Lateral etching of the first dielectric layer 610 forms an undercut region 630 beneath second dielectric layer 620. An example etching as described above process may remove as much as 70% of the original width (w) of the first dielectric layer 610. e.g., 20, 30, 40, 50, 60 or 70%, including ranges between any of the foregoing values. For instance, and by way of example, an initial thickness of the first dielectric layer within the gate cut opening may be 16 nm, and a final thickness of the first dielectric layer may be 5 nm. In such an example, the distance from a sidewall 612 of the first dielectric layer 610 to an adjacent fin 120 may be 5.5 nm greater than the projected distance from a sidewall 622 of the second dielectric layer 620 to the fin, i.e., r2=r1+5.5 nm. This lateral increase in the distance between the semiconductor fin and the gate cut dielectric may provide adequate space for deposition of a gate stack over the fin immediately adjacent to the gate cut.

In various embodiments, the remaining thickness of the first dielectric layer 610 is effective to electrically isolate a functional gate formed on one side of the first dielectric layer from a functional gate formed on the other side of the first dielectric layer.

Figure 8:
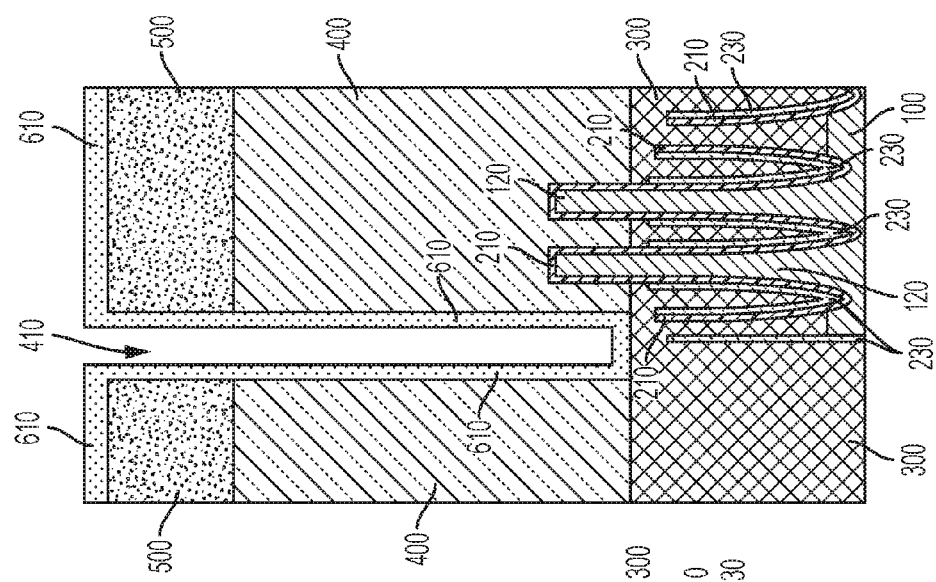
FIG. 8 shows deposition of a conformal first dielectric layer into the gate cut opening formed during the gate cut module according to a further embodiment.
Figure 7:
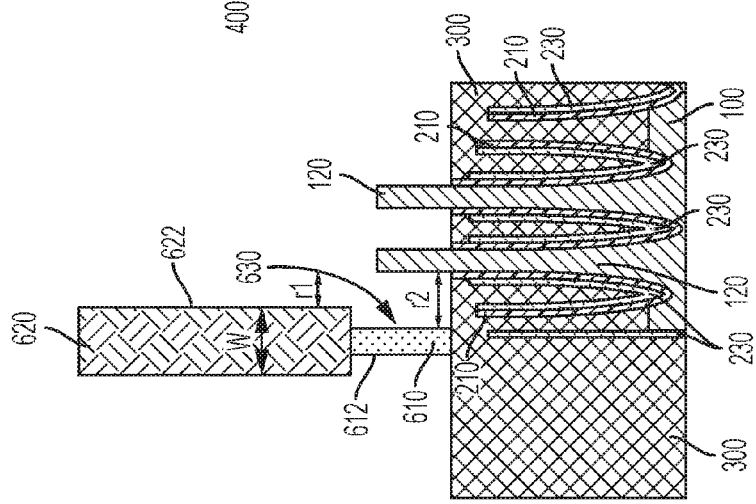
FIG. 7 shows removal of an extended gate (EG) oxide layer from over the fins and partial etching of the first dielectric layer to form a gap between remaining portions of the first dielectric layer and an adjacent fin.

Turning to FIGS. 8-17, a gate cut architecture according to a further embodiment is described. Referring to FIG. 8, a conformal first dielectric layer 610 is deposited into gate cut opening 410. In various embodiments, formation of a conformal first dielectric layer 610 includes a deposition process such as chemical vapor deposition (CVD). The thickness of the first conformal dielectric layer 610 may range from 2 to 8 nm, for example, e.g., 2, 4, 6 or 8 nm, including ranges between any of the foregoing values. In various embodiments, the first dielectric layer 610 comprises silicon dioxide.

Referring to FIG. 9, deposition of the first dielectric layer 610 is followed by the deposition of a blocking mask layer 615 over the first dielectric layer 610 to fill the gate cut opening 410. As will be appreciated, blocking mask layer 615 is used to control removal of the conformal first dielectric layer 610 within the gate cut opening during subsequent processing. Blocking mask layer 615 may comprise amorphous carbon, for example.

A blocking mask layer 615 comprising amorphous carbon may be formed from a gas mixture comprising a hydrocarbon source and a diluent gas at a deposition temperature of 200° C. to 700° C. Optionally, an as-deposited amorphous carbon (a-C) layer may be cured such as by exposure to UV radiation at a curing temperature greater than 200° C.

Exemplary hydrocarbon compounds that may be included in the hydrocarbon source used to form the amorphous carbon layer may be described by the formula $C_xH_y$, where $1 \leq x \leq 10$ and $2 \leq y \leq 30$. Such hydrocarbon compounds may include, but are not limited to alkanes such as methane, ethane, propane, butane and its isomer isobutane, pentane and its isomers isopentane and neopentane, hexane and its isomers 2-methylpentane, 3-methylpentane, 2,3-dimethylbutane, 2,2-dimethyl butane, and the like; alkenes such as ethylene, propylene, butylene and its isomers, pentene and its isomers, and the like; dienes such as butadiene, isoprene, pentadiene, hexadiene and the like, and halogenated alkenes include monofluoroethylene, difluoroethylenes, trifluoroethylene, tetrafluoroethylene, monochloroethylene, dichloroethylenes, trichloroethylene, tetrachloroethylene, and the like; and alkynes such as acetylene, propyne, butyne, vinylacetylene and derivatives thereof. Further hydrocarbon compounds include aromatic molecules such as benzene, styrene, toluene, xylene, ethylbenzene, acetophenone, methyl benzoate, phenyl acetate, phenol, cresol, furan, and the like, as well as halogenated aromatic compounds including monofluorobenzene, difluorobenzenes, tetrafluorobenzenes, hexafluorobenzenes and the like.

Suitable diluent gases may include, but are not limited to, hydrogen ($H_2$), helium (He), argon (Ar), ammonia ($NH_3$), carbon monoxide (CO), carbon dioxide ($CO_2$), and mixtures thereof.

Thereafter, referring to FIG. 10, an etching step is used to remove the blocking mask layer 615 from over the sacrificial gate layer 400, i.e., from over the lithography stack 500, and to recess the blocking mask layer 615 within the gate cut opening 410. The etching step can comprise, for example, a reactive ion etching (RIE) process.

According to various embodiments, following the recess etch, the height of the blocking mask layer 615 is greater than the height of the neighboring fins 120, and may exceed the fin height by 10 to 200%, e.g., 10, 20, 50, 100, 150 or 200%, including ranges between any of the foregoing values.

As seen with reference to FIG. 11, during a subsequent etch-back step to remove the conformal first dielectric layer 610 from upper portions of the gate cut opening 410, the blocking mask layer 615 serves as an etch mask to control the removal of the conformal first dielectric layer 610, such that the height of the conformal first dielectric layer 610 is equal to the height of the blocking mask layer 615. That is, the height of the first dielectric layer 610 is greater than the height of the neighboring fins 120.

Referring to FIG. 12, after etching the conformal dielectric layer 610, the blocking mask layer 615 is removed selective to the first dielectric layer 610. A blocking mask layer of amorphous carbon may be removed by etching with a plasma comprising oxygen. An example plasma includes oxygen, hydrogen, and fluorine-containing gas such as $NF_3$, $SF_6$, $CF_4$, or combinations thereof. Optionally, the plasma may further comprise HBr, $N_2$, He, Ar, or combinations thereof.

Figure 13:
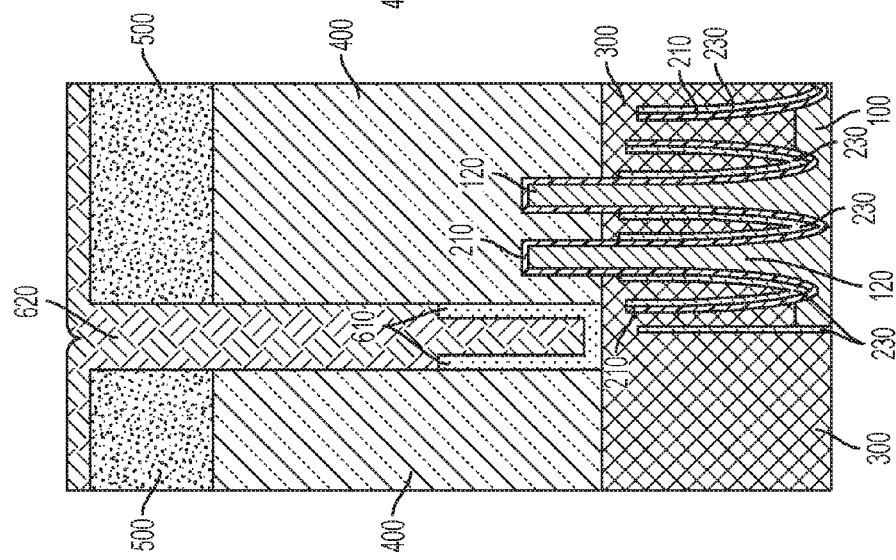
FIG. 13 illustrates the deposition of a second dielectric layer into the gate cut opening and over the conformal first dielectric layer.
Figure 17:
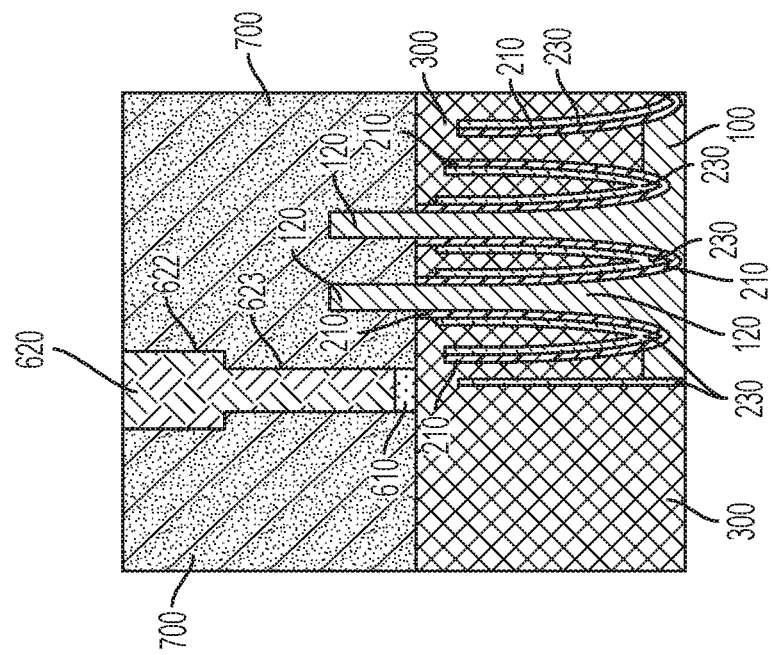
FIG. 17 shows the deposition of a replacement gate architecture within the gap of FIG. 16 and over the fins.

Referring to FIG. 13, as in the first embodiment, a fill layer 620 is deposited within gate cut opening 410. Fill layer 620 is deposited over the conformal first dielectric layer 610 and completely fills the gate cut openings 410. The fill layer 620 may be formed by atomic layer deposition (ALD) and may comprise a second dielectric material such as silicon nitride.

Figure 14:
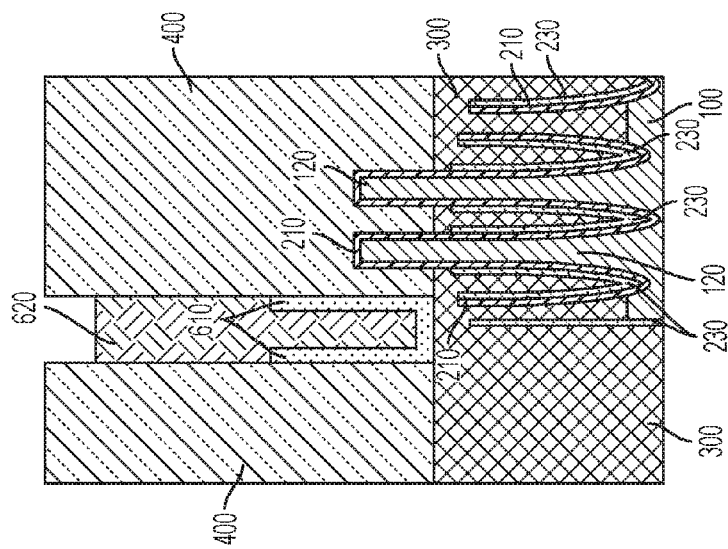
FIG. 14 shows removal of the lithography stack and excess second dielectric layer from over the sacrificial gate layer.

Referring to FIG. 14, a CMP step is used to selectively remove excess fill layer material from over sacrificial gate layer 400 and form a planarized structure. The sacrificial gate layer 400 may serve as a CMP etch stop during removal of the excess fill layer material as well as lithography stack 500.

Figure 15:
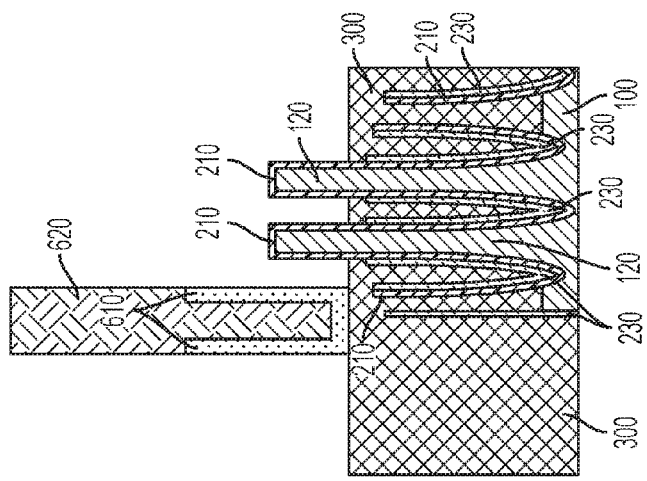
FIG. 15 illustrates selective removal of the sacrificial gate layer.

Thereafter, referring to FIG. 15, a selective etching step is used to remove the sacrificial gate layer 400. A wet etch or a dry etch or a combination of wet and dry etch processes may be used to remove the sacrificial gate layer.

Figure 16:
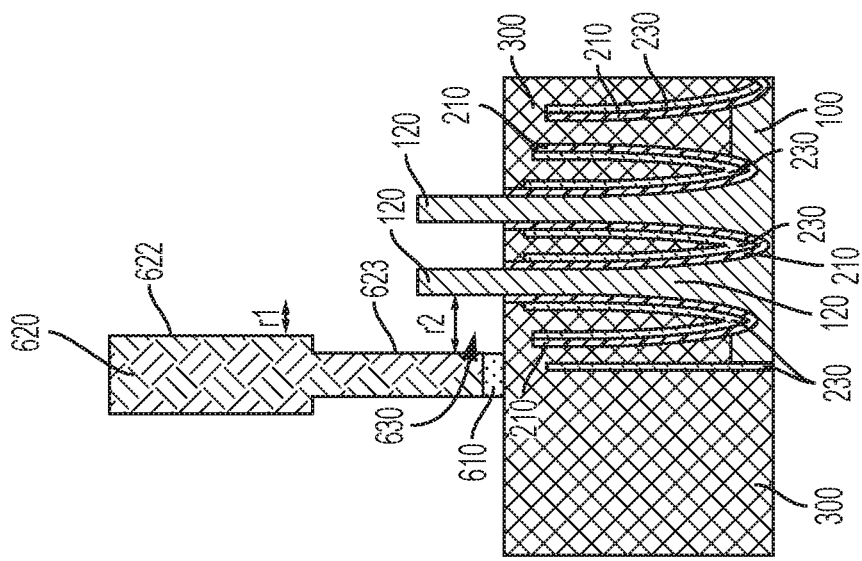
FIG. 16 shows removal of the extended gate (EG) oxide layer from over the fins and partial etching of the first dielectric layer to form a gap between remaining portions of the first and second dielectric layers and an adjacent fin.

FIG. 16 shows the subsequent removal of the extended gate (EG) oxide layer from over the fins as well as the partial removal of the conformal first dielectric layer. The conformal dielectric layer 610 presents a surface that may be etched selectively and thereby recessed laterally. Lateral etching of the first dielectric layer 610 forms an undercut region 630 beneath an upper portion of the second dielectric layer 620 exposing a second sidewall surface 623 of the second dielectric layer that is set back relative to a first sidewall surface 622.

The method forms a laterally recessed second dielectric layer proximate to the semiconductor fins 120. In contrast to the first embodiment, where the isolation dielectric proximate to the fins within the active device region 124 comprises the first dielectric material (e.g., silicon dioxide), in the second embodiment, the isolation dielectric comprises the second dielectric material (e.g., silicon nitride). In the illustrated embodiment, partial removal of the first dielectric layer results in a distance (r2) between the second sidewall surface 623 of the second dielectric layer and the adjacent fin 120, where r2>r1.

According to various embodiments, the first and second dielectric layers cooperate to form a gate cut dielectric layer that is effective to electrically isolate a functional gate formed on one side of the gate cut dielectric layer from a functional gate formed on the other side of the gate cut dielectric layer.

As will be appreciated, additional processing may be used to complete the FinFET device, including the formation of a functional gate structure 700 including gate dielectric and gate conductor layers (not separately shown) over channel regions of the fins 120.

The disclosed methods enable the formation of sacrificial gate structures, and ultimately functional gate structures, having a small (e.g., less than 15 nm) cut dimension along a longitudinal direction, and a substantially straight (vertical) profile, which may beneficially impact device density and performance. According to various embodiments, the method includes backfilling a gate cut opening with etch selective dielectric materials. Partial etching of one of the dielectric materials can be used to increase the distance between the gate cut structure and an adjacent fin relative to methods that do not perform a backfilling step using etch selective materials. Advantageously, the method does not impact the overall design rules for manufacture of the device.

As used herein, the singular forms "a," "an" and "the" include plural referents unless the context clearly dictates otherwise. Thus, for example, reference to a "gate cut opening" includes examples having two or more such "gate cut openings" unless the context clearly indicates otherwise.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred. Any recited single or multiple feature or aspect in any one claim can be combined or permuted with any other recited feature or aspect in any other claim or claims.

It will be understood that when an element such as a layer, region or substrate is referred to as being formed on, deposited on, or disposed "on" or "over" another element, it can be directly on the other element or intervening elements may also be present. In contrast, when an element is referred to as being "directly on" or "directly over" another element, no intervening elements are present.

While various features, elements or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to a hard mask that comprises amorphous silicon include embodiments where a hard mask consists essentially of amorphous silicon and embodiments where a hard mask consists of amorphous silicon.

It will be apparent to those skilled in the art that various modifications and variations can be made to the present invention without departing from the spirit and scope of the invention. Since modifications, combinations, sub-combinations and variations of the disclosed embodiments incorporating the spirit and substance of the invention may occur to persons skilled in the art, the invention should be construed to include everything within the scope of the appended claims and their equivalents.

What is claimed is:

1. A method of forming a semiconductor structure, comprising:
   forming a sacrificial gate layer over a plurality of semiconductor fins;
   forming a gate cut opening that extends through the sacrificial gate layer, wherein the gate cut opening is laterally spaced away from a first one of the fins by a first distance;
   depositing a first dielectric layer into the gate cut opening, wherein a height of the first dielectric layer is greater than a height of the first one of the fins;
   depositing a second dielectric layer into the gate cut opening and over the first dielectric layer;
   selectively removing the sacrificial gate layer with respect to the first and second dielectric layers; and
   etching the first dielectric layer to form a gap adjacent to the first one of the fins, wherein a width of the gap is greater than the first distance.

2. The method of claim 1, wherein the sacrificial gate layer comprises amorphous silicon.

3. The method of claim 1, wherein the gate cut opening extends completely through the sacrificial gate layer.

4. The method of claim 1, wherein the gate cut opening has substantially vertical sidewalls.

5. The method of claim 1, wherein depositing the first dielectric layer comprises forming a conformal layer within the gate cut opening.

6. The method of claim 1, wherein the first dielectric layer comprises silicon dioxide and the second dielectric layer comprises silicon nitride.

7. The method of claim 1, wherein a portion of the gap formed by etching the first dielectric layer underlies a portion of the second dielectric layer.

8. The method of claim 1, further comprising recessing the first dielectric layer within the gate cut opening prior to depositing the second dielectric layer.

9. The method of claim 1, wherein the first distance is less than 20 nm.

10. The method of claim 1, further comprising forming a gate dielectric layer over the first one of the fins and forming a gate conductor layer over the gate conductor layer, wherein the gate dielectric layer and the gate conductor layer completely fill the gap.

11. A semiconductor structure, comprising:
    a fin disposed over a semiconductor substrate;
    a gate stack disposed over the fin, wherein the gate stack comprises a gate dielectric formed over the fin and a gate conductor formed over the gate dielectric; and
    a gate cut dielectric layer laterally spaced from the fin and contacting the gate stack, wherein the gate cut dielectric comprises a first dielectric layer laterally spaced from the fin by a first distance and a second dielectric layer disposed over the first dielectric layer and laterally spaced from the fin by a second distance less than the first distance.

12. The structure of claim 11, wherein the first dielectric layer comprises a sidewall surface laterally spaced from the fin by the first distance and the second dielectric layer comprises a sidewall surface laterally spaced from the fin by the second distance.

13. The structure of claim 11, wherein a height of first dielectric layer is greater than a height of the fin.

14. The structure of claim 11, wherein the first dielectric layer comprises silicon dioxide and the second dielectric layer comprises silicon nitride.

15. The structure of claim 11, wherein:
    the first dielectric layer comprises a sidewall surface laterally spaced from the fin by the first distance;
    the second dielectric layer comprises a first sidewall surface laterally spaced from the fin by the first distance; and
    the second dielectric layer comprises a second sidewall surface laterally spaced from the fin by the second distance.

* * * * *